United States Patent [19]
Hofmann et al.

[11] 4,284,910
[45] Aug. 18, 1981

[54] ADDRESS BUFFER FOR A MOS-MEMORY MODULE

[75] Inventors: Ruediger Hofmann, Munich; Paul W. von Basse, Wolfratshausen/Farchet, both of Fed. Rep. of Germany

[73] Assignee: Siemens Aktiengesellschaft, Berlin & Munich, Fed. Rep. of Germany

[21] Appl. No.: 66,524

[22] Filed: Aug. 15, 1979

[30] Foreign Application Priority Data

Sep. 15, 1978 [DE] Fed. Rep. of Germany ....... 2840329

[51] Int. Cl.³ .............................................. H03K 5/00
[52] U.S. Cl. ......................... 307/238.4; 307/DIG. 1; 307/260
[58] Field of Search ................. 307/DIG. 1, 260, 261, 307/238

[56] References Cited
U.S. PATENT DOCUMENTS

| 4,077,031 | 2/1978 | Kitagawa et al. | 307/238 |
| 4,087,704 | 5/1978 | Mehta et al. | 307/DIG. 1 |
| 4,214,175 | 7/1980 | Chan | 307/DIG. 1 |

*Primary Examiner*—Harold A. Dixon
*Attorney, Agent, or Firm*—Hill, Van Santen, Steadman, Chiara & Simpson

[57] ABSTRACT

An address buffer is disclosed in MOS technology with an address memory circuit exhibiting an address input driven via a transfer signal and having two complementary address outputs and two complementary signal outputs of high signal level. An isolating amplifier is provided with a following-connected output stage. The isolating amplifier is driven via a control clock pulse and supplies complementary control signals. It also has two parallel paths each consisting of the driven segments of two transistors. These parallel paths are connected to the drive clock pulse at a first common node and are connected to a base voltage source at a second common node. The first transistor of each parallel path is driven via a respective high signal level signal output of the address memory circuit and the second transistor of each parallel path is driven via a respective address output of the address memory circuit which is inverse to the high level signal output.

4 Claims, 7 Drawing Figures

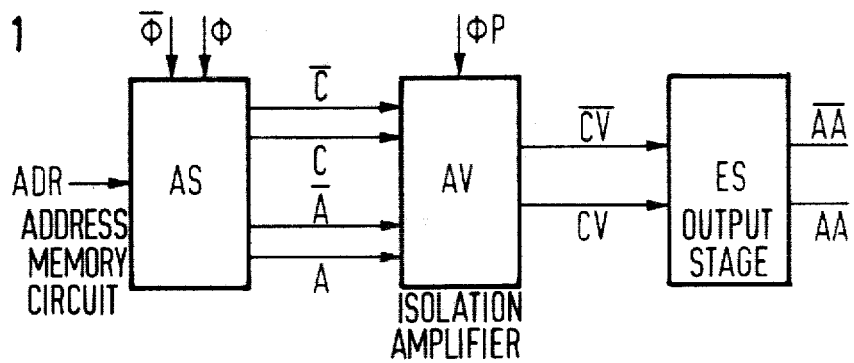
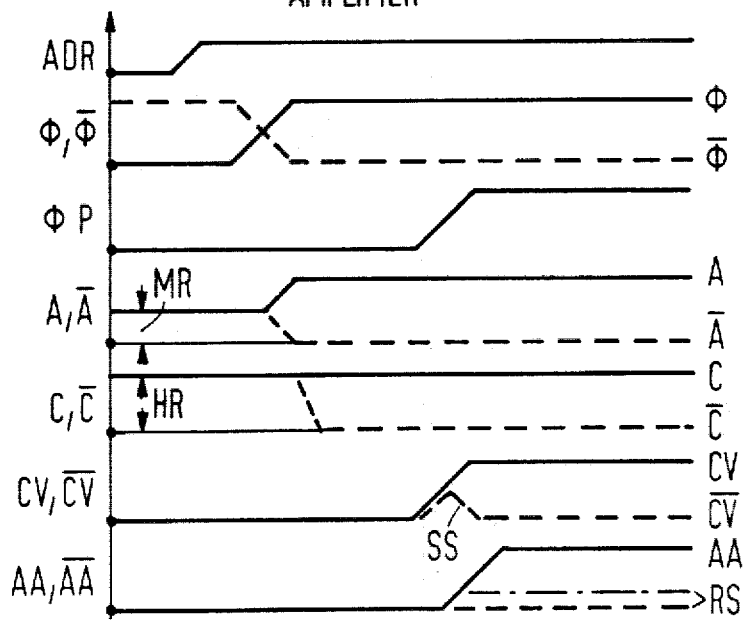
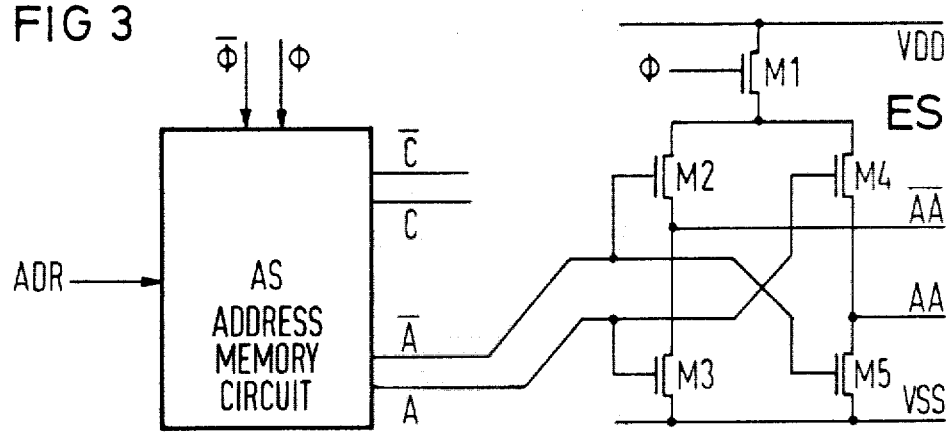

ADDRESS BUFFER FOR A MOS-MEMORY MODULE

BACKGROUND OF THE INVENTION

The invention relates to an address buffer in MOS technology with an address memory circuit exhibiting an address input, a control input for a transfer signal, two complementary address outputs, and two complementary signal outputs of high signal level. The address buffer also has an isolation amplifier and a following-connected output stage.

Address buffers for MOS memory modules generally consist of three parts, namely, an address memory circuit, a following-connected isolating amplifier, and a following output stage. Accordingly, the address memory circuit has the job of pre-amplifying up to the MOS level the TTL address signals and to take them over. The complementary address output signals A and $\overline{A}$ as well as the allocated high voltage signals with a maximum potential of one and one half times the operating voltage C and $\overline{C}$ can be tapped at its output.

The following-connected isolating amplifiers function as intermediate amplifiers and separate the outputs of the address memory circuit, which can be only slightly loaded, from the output stages. Therefore, these blocking preliminary stages supply the complementary control signals CV and $\overline{CV}$ which both have an idle level of 0 volts.

The isolating amplifiers themselves are connected with the output stages which only represent power amplifiers which supply the complementary address signals AA and $\overline{AA}$ to the decoders via the address line.

In order to prevent multiple or erroneous selection in the decoders, it is necessary that the outputs of the output stages which are driven if necessary with the information "0", exhibit no voltage peaks or residual voltages that are greater than an allocated threshold voltage.

Known address buffers (Intel memory module 2104 and 2107) only exhibit output stages without isolating amplifiers in addition to the address memory circuit. Therefore, it is a matter of pure push-pull output stages which are driven by the address outputs A and $\overline{A}$ of the address memory circuit. These output stages are not activated by means of a special start clock pulse but rather by means of the transfer clock pulse of the address memory circuit. Although this technique has the advantage that one obtains the address output signals AA and $\overline{AA}$ of the output stage very early, great voltage peaks occur, however, at the output driven under certain conditions with the zero information signal. The size of these disturbing voltages can only be limited by means of an appropriate choice of the output stage transistors, which in turn leads to significant cross-currents in the output stages, whereby these output stage transistors must be dimensioned very large.

In another known address buffer (Mostek memory module MK4027 and MK4116) output stages with blocking preliminary stages are provided. Here, the isolating amplifiers consist of a static flip-flop whose load transistors are driven by means of the high voltage signals C and $\overline{C}$ of the address memory circuit. Here, too, voltage peaks can occur at the outputs of the blocking preliminary stages CV or respectively $\overline{CV}$ when the information "0" is to be supplied.

The output stage employed in the known address buffer is a simple source follower which has the undesired property of also boosting the outputs of the output stage AA or, respectively $\overline{AA}$ when they are only driven with short disturbing voltage peaks.

SUMMARY OF THE INVENTION

An object of the invention is to provide an address buffer for a MOS memory module at whose output no voltage peaks or residual voltages arise and which exhibits output stage transistors of small dimensions.

This object is achieved according to the invention in that the isolating amplifiers driven by a control clock pulse and supplying complementary control signals exhibits two parallel chains or paths connected to a drive clock pulse at a first common node, connected adjacent to a base voltage source at a second common node, and each path consisting of the driven portions of two transistors. The first transistor of each parallel chain or path is driven by a respective high signal level output of the address memory circuit; and the second switching transistor of each parallel chain or path is driven via a respective address output of the address memory circuit which is inverse with respect to the signal output of high signal level.

Only low disturbing voltage peaks occur at the outputs CV or, respectively, $\overline{CV}$ of the isolating amplifier since the isolating amplifiers are driven both by the outputs A and $\overline{A}$ of the address memory circuit as well as by the signal outputs of the address memory circuit with high signal level C and $\overline{C}$. The cross-currents occurring in the isolating amplifiers during the positive edge of the drive clock pulse are small, so that the transistors employed need only be of small size.

BRIEF DESCRIPTION OF THE DRAWINGS

FIG. 1 is a block diagram of the construction of an address buffer;

FIG. 2 is a schematic representation of a pulse pattern for operating an address buffer;

FIG. 3 is a schematic representation of a known address buffer without an isolating amplifier;

DESCRIPTION OF THE PREFERRED EMBODIMENTS

Figure 4:
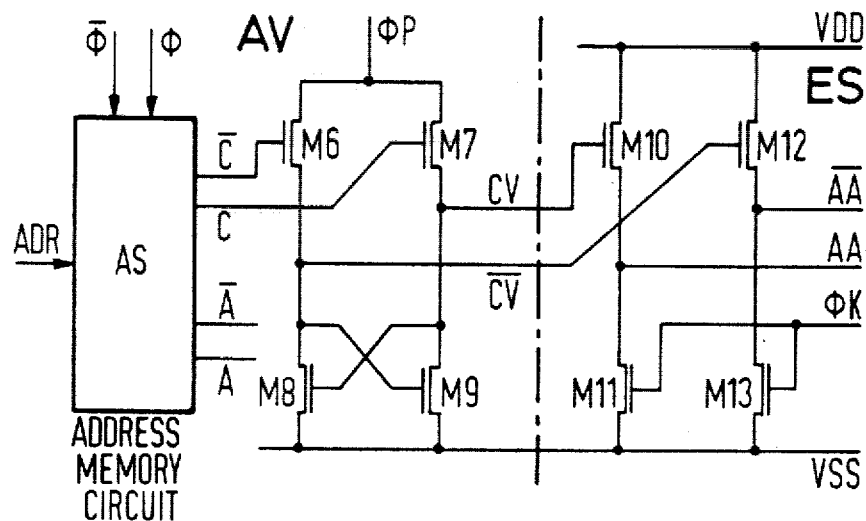
FIG. 4 is a schematic representation of a known address buffer with an isolating amplifier consisting of a static flip-flop.

An address buffer for a MOS memory module is illustrated in FIG. 1 with its corresponding pulse pattern illustrated in FIG. 2. The buffer generally consists of three parts, namely, an address memory circuit AS, a following-connected isolating amplifier AV, and a corresponding output stage ES.

The address memory circuit AS has the task of preamplifying the TTL address signals ADR supplied to the MOS stage and of acquiring them during the clock pulse of a transfer clock pulse $\phi$. The address memory circuit AS supplies the complementary address output signals A and $\overline{A}$, as well as two further signals with higher signal level C, $\overline{C}$ which have the same informational content as the address output signals A and $\overline{A}$ but exhibit a significantly higher potential, namely approximately 1.5 times the operating voltage VDD.

The following-connected isolating amplifiers AV function as intermediate amplifiers and separate the outputs of the address memory circuit AS which can be only lightly loaded from the output stages ES. Such an isolating amplifier is driven via an activation pulse $\phi$P, which causes the information to be transferred from the address memory circuit AS into the isolating amplifier. The isolating amplifier AV itself supplies the complementary output signals CV and $\overline{CV}$ which both exhibit an idle level of approximately 0 volts.

The output stage ES is a pure power amplifier which supplies the complementary signals AA and $\overline{AA}$ to the decoder via address lines.

In order to prevent falsification of information in the decoders due to multiple or erroneous selection, it is necessary that the outputs of the output stages at which the information "0" is pending exhibit no voltage peaks or residual voltages which are larger than a possible residual voltage RS. In order to prevent this, it is necessary that the output signals CV and $\overline{CV}$ of the isolating amplifier at which the information "0" will be present likewise exhibit no voltage peaks SS (FIG. 2) which go beyond a defined tolerance range.

In the known address buffer illustrated in FIG. 3 (Intel Firm, Memory module 2104 and 2107), no isolating amplifier is present. A pure push-pull stage is employed as the output stage ES. This is driven via the outputs A and $\overline{A}$ of the address memory circuit AS. Accordingly, the output stage ES is not activated by means of a separate clock pulse but rather by means of the transfer clock pulse $\phi$ of the address memory circuit AS. One obtains the complementary signals AA and $\overline{AA}$ of the output stage ES very early by means of this feature; however, the higher voltage peaks occur at the output of the output stage ES at which the information "0" is pending. The cause of these voltage peaks is that the output stage is already activated by means of the transfer clock pulse $\phi$ of the address memory circuit AS although the outputs A and $\overline{A}$ of the address memory circuit AS only assume a defined state a certain time after the positive edge of the clock pulse $\phi$ (as can be seen from FIG. 2). The height of the disturbing voltages occurring can be limited only by means of suitable dimensioning or size of the output stage transistors M1 through M5. This, however, leads to significant cross-currents in the output stages since all transistors M1 through M5 are simultaneously conductively driven during the activation of the outputs AA and $\overline{AA}$ of the output stage ES and these transistors must therefore be dimensioned very large as output stage transistors.

The known address buffer illustrated in FIG. 4 (Mostek Firm, memory modules MK4027, MK4116) exhibits an isolating amplifier AV. Here, the isolating amplifier AV consists of a static flip-flop consisting of the transistors M6 through M9 whose load transistors M6 and M7 are driven by means of the signals of high signal level outputs C and $\overline{C}$ of the address memory circuit AS. Here, too, voltage peaks can occur at the outputs of the blocking preliminary stage CV or respectively, $\overline{CV}$ when the information "0" is pending. These voltage peaks are generated when the positive edge of the transfer activation pulse $\phi$P follows too soon after the positive edge of the transfer clock pulse $\phi$ and, thus, the isolating amplifier AV is already turned on although the outputs C and $\overline{C}$ of the address memory circuit AS does not yet exhibit any defined conditions. Given the close sequence of the transfer clock pulses $\phi$ and of the activation pulse $\phi$P, the potentials of both outputs CV and $\overline{CV}$ of the isolating amplifier AV are boosted simultaneously with the activation pulse $\phi$P as a result of the cross-coupling of transistors M8 and M9. Only when the potential of both outputs lies far above a defined threshold voltage of the two transistors M8 and M9 does the cross-coupling function and the flip-flop flips in accordance with the magnitude of the signals C and $\overline{C}$.

Only a simple source follower consisting of transistors M10 and M12 is employed here as the output stage ES. Allocated erase transistors M11 and M13 again set the outputs AA and $\overline{AA}$ back to the zero potential with the assistance of an erase clock pulse $\phi$K. The outputs AA or, respectively $\overline{AA}$ are also boosted by the source follower when they are only driven with short disturbing voltage peaks. There accordingly exists the possibility that residual voltages are adjacent at the outputs in this case which are greater than the threshold voltage to be tolerated upon application of zero information. These residual voltages are only lowered by the erase clock pulse $\phi$K at the end of a working cycle and remain stored in the address line of the decoder during the remaining time.

Figure 5:
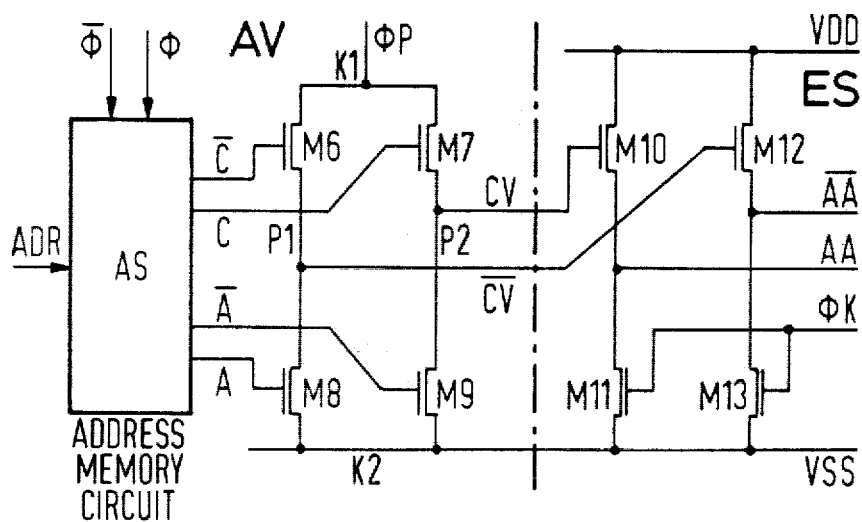
FIG. 5 is a schematic representation of the address buffer of the invention with a source follower as an output stage.

If an address buffer according to FIG. 5 is constructed in such manner that the isolating amplifier AV is driven both by the outputs A and $\overline{A}$ of the address memory circuit AS as well as by the outputs with boosted potential C and $\overline{C}$, then the disadvantages described above cannot occur.

The blocking preliminary stage according to the invention, with the transistors M6 through M9, is constructed as a push-pull output stage whose upper transistors M6 and M7 are driven by the outputs of the address memory circuit AS with boosted potential C and $\overline{C}$. By so doing, only very small disturbing voltage peaks occur at the outputs CV and $\overline{CV}$ of the isolating amplifier EV when the information "0" is pending. This has the following reasons: before the positive edge of the transfer clock pulse $\phi$, the outputs A and $\overline{A}$ are at an average idle potential MR (see FIG. 2), the outputs C and $\overline{C}$ are at high idle potential HR which approximately corresponds to the operating voltage VDD, and the activation clock pulse $\phi$P is at 0 potential. Therefore, all transistors M6 through M9 of the isolating amplifier AV are conductive and hold the points CV and $\overline{CV}$ at 0 potential (base voltage source ESS). Shortly after the positive edge of the transfer clock pulse $\phi$, the voltage of one of the two outputs A or, respectively, $\overline{A}$ proceeds towards 0 potential and the other output proceeds toward the operating voltage VDD. Therefore, one of the two transistors M8 or M9 is blocked and the other becomes even more strongly conductive. The conductively driven transistor of the two transistors M8 or M9 supplies the information "0" at output $\overline{CV}$ or, respectively, CV. If the positive edge of the activation pulse $\phi$P already occurs now, although the outputs with boosted potential C and $\overline{C}$ have not yet reached the final levels, whether they be the base potential VSS or a potential that is greater than the operating potential VDD by the factor 1.5, then the output CV or respectively $\overline{CV}$ at which the information "0" will be present is fixed by means of the strongly conductive transistor M8 or respectively M9. A voltage drop occurs at these transistors only because of the divider relationship of the transistors M6 and M7 or, respectively, the transistors M8 and M9. This voltage drop can be kept very small by means of suitable dimensioning. As soon as the points C and $\overline{C}$ have reached their final level, the outputs CV and $\overline{CV}$ of the isolating amplifier also assume their final level of 0 volts base voltage potential VSS or operating voltage potential VDD. Only one transistor, i.e. M6 and M9 or M7 and M8, is then conductive in each branch of the isolating amplifier AV. Therefore, no cross-current can flow through the push-pull output stages. The clock pulse $\phi$P thus is only loaded during the edge of the pulse.

This cross-current occurring in the isolating amplifier AV during the positive edge of the activation clock pulse $\phi$P is small, so that the isolating amplifier can be provided with small transistors also because of its function as an intermediate amplifier.

A control process occurs between the clock pulse generator (not illustrated here) supplying the activation clock pulse $\phi$P and the isolating amplifier AV. As long as all outputs of the address storage circuit A, $\overline{A}$, C, $\overline{C}$ have not assumed their final level, that is as long as cross-currents can occur in the isolating amplifier AV, the activation clock pulse $\phi$P of the isolating amplifier AV is so strongly loaded that its positive edge is retarded. Therefore, the positive edge of the clock pulse $\phi$P, which must drive the isolating amplifiers of all address buffers, adapts itself to the time behavior of the address memory circuit AS. As soon as the outputs A, $\overline{A}$ and C, $\overline{C}$ of the address memory circuit have assumed their final state, cross-currents can no longer flow. The clock pulse $\phi$P is thus relieved and can activate the isolating amplifier AV. This then supplies the signals CV and $\overline{CV}$ to the output stage ES in accordance with its maximum switching speed.

Three solutions are possible for the final stages ES comprised of according to FIG. 5, a simple source follower consisting of transistors M10 and M12 with the allocated erase transistors M11 and M13. This circuit requires only a few transistors but has the disadvantage that only the signals which contain the information "1" can be supplied with low-resistance, whereas the outputs AA or, respectively $\overline{AA}$ exhibit an undefined resistance value upon application of the information "0".

Figure 6:
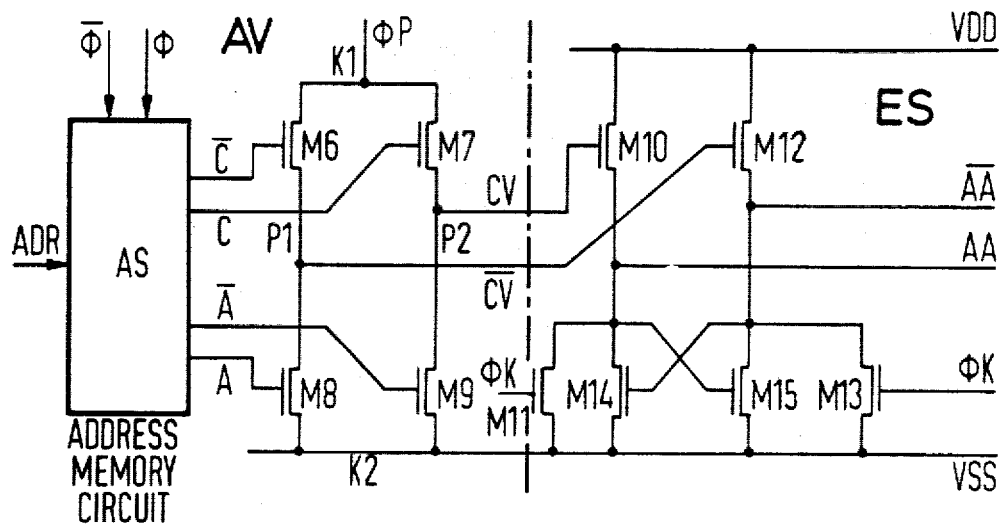
FIG. 6 is a schematic representation of an address buffer of the invention with an output stage designed as a static flip-flop.

The output stage ES illustrated in FIG. 6 is a static flip-flop consisting of the transistors M10 through M15 whose load transistors M10 and M12 function as a source follower and are driven by the signals CV and $\overline{CV}$ of the isolating amplifier AV. This circuit supplies the signals with information "0" as well as the signals with information "1" at a low resistance to the outputs AA and $\overline{AA}$. Moreover, this circuit is also favorable for lay-out reasons since the cross-coupled transistors M14 and M15 can be incorporated on the chip at any desired location in the address lines between the output stages ES and the decoders. These transistors are only driven by the addresses and not by other clock pulses. They therefore need not be arranged on the integration surface of the address buffer on the chip.

Figure 7:
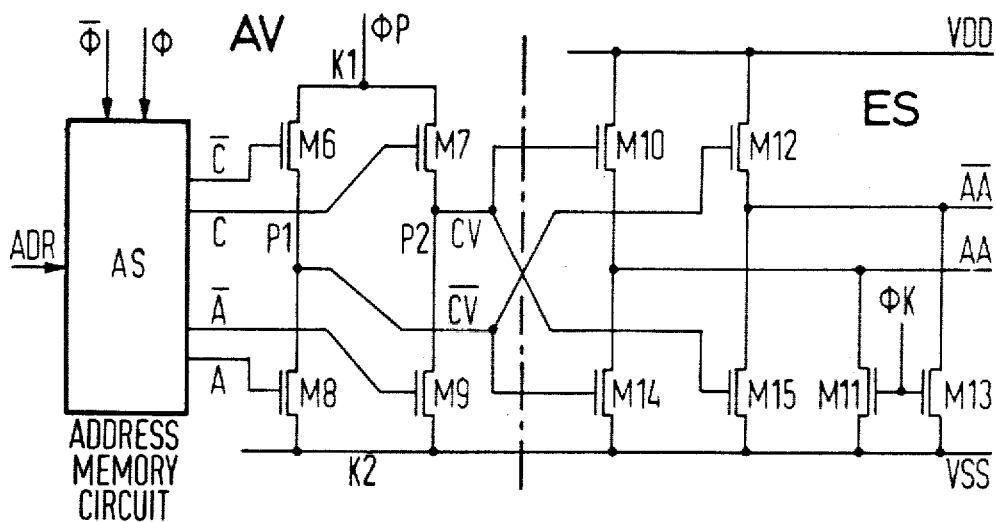
FIG. 7 is a schematic representation of an address buffer of the invention with a push-pull output stage.

The address buffer illustrated in FIG. 7 exhibits an output stage ES which is designed as a push-pull stage. This output stage with the transistors M10 through M15 and the allocated erase transistors M11 and M13 also supplies the information signal "0" as well as the information "1" at a low-resistance to the outputs AA and $\overline{AA}$. A greater integration surface with the surface of the address buffer is required because of the line cross-over from between the gates of the transistors M15 and M10 and the gates of the transistors M12 and M14 produced by the cross-coupling.

All of the output stages ES described require an erase pulse $\phi$K at the end of the working cycle of the memory module. This erase pulse lowers the outputs AA and $\overline{AA}$ to the idle potential (VSS) with the assistance of the erase transistors M11 and M13.

Any known arrangements as employed in the known memory modules discussed may be used for the address memory circuit AS not described here.

| List of reference symbols | |
|---|---|
| AS | address memory circuit |
| AV | isolating amplifier |
| ES | output stage |
| ADR | TTL-address signals |
| $\phi$, $\overline{\phi}$ | transfer clock pulse |
| A, $\overline{A}$ | address output signals |
| C, $\overline{C}$ | output signals with boosted signal level |
| VDD | operating voltage |
| $\phi$P | activation pulse |
| AA, $\overline{AA}$ | output signals of the power amplifier ES |
| CV, $\overline{CV}$ | output signals of the isolating amplifier AV |
| RS | residual voltage |
| SS | voltage peaks |
| VSS | base voltage |
| M1–M15 | transistors |
| P1, P2 | parallel chains or paths |
| K1, K2 | nodes |
| $\phi$K | erase clock pulse |
| MR | average idle potential |
| HR | high idle potential |

Although various minor modifications may be suggested by those versed in the art, it should be understood that we wish to embody within the scope of the patent warranted hereon, all such embodiments as reasonably and properly come within the scope of our contribution to the art.

We claim as our invention:

1. An address buffer in MOS technology comprising: an address memory circuit having an address input driven via a transfer signal, two complementary address outputs, and two complementary high signal level outputs; an isolating amplifier; a following-connected output stage; the isolating amplifier being driven via a control clock pulse and having outputs for complementary control signals; the isolating amplifier having two parallel paths each comprising two transistors, said parallel paths being connected to the control clock pulse via a first common node and being connected to a base voltage source via a second common node; a first transistor of each parallel path being driven by a respective one of the two high signal level outputs of the address memory circuit; and a second transistor of each parallel path being driven by a respective one of the two address outputs of the address memory circuit, the high signal level output driving the first transistor of one of the paths being the inverse of the address output driving the second transistor of the same path.

2. A buffer according to claim 1 wherein the output stage comprises a static flip-flop having two cross-coupled transistors, load transistors and respective erase transistors, the load transistors connecting the cross-coupled transistors with a supply potential and being driven by the complementary control signals of the isolating amplifier.

3. A circuit arrangement according to claim 1 wherein the output stage comprises a push-pull circuit arrangement having two first and second parallel paths each comprising first and second transistors; a first of the complementary control signals of the isolating amplifier connected with a control input of the first transistor of the first parallel path and the second transistor of the second parallel chain, and the second complementary control signal being connected with a control input of the second transistor of the first parallel path and the first transistor of the second parallel path; and outputs of the output stage having respective erase transistors allocated to them.

4. An address buffer system, comprising:
 (a) an address memory circuit having normal and inverse complementary address outputs and normal and inverse complementary higher signal level address outputs;
 (b) an output stage;
 (c) an isolating amplifier between the address memory circuit and output stage, the isolating amplifier comprising:
   (i) two parallel paths each having two series connected transistors;
   (ii) the parallel paths being commonly connected between a control clock pulse and a voltage source; and
   (iii) the transistors of one of the paths respectively connecting to the normal address output and inverse higher signal lines address output, and the transistors of the other of the paths respectively connecting to the inverse address output and the normal higher signal level address output.

* * * * *